United States Patent

Oshima

[11] Patent Number: 6,158,037
[45] Date of Patent: Dec. 5, 2000

[54] MEMORY TESTER

[75] Inventor: Hiromi Oshima, Ohura-gun, Japan

[73] Assignee: Advantest Corporation, Tokyo, Japan

[21] Appl. No.: 09/091,606

[22] PCT Filed: Oct. 23, 1997

[86] PCT No.: PCT/JP97/03851

§ 371 Date: Jun. 19, 1998

§ 102(e) Date: Jun. 19, 1998

[87] PCT Pub. No.: WO98/18133

PCT Pub. Date: Apr. 30, 1998

[30]     Foreign Application Priority Data

Oct. 23, 1996  [JP]  Japan .................................. 8-280661

[51] Int. Cl.$^7$ .................................................. G06F 11/00
[52] U.S. Cl. .......................... 714/743; 714/719; 714/738
[58] Field of Search ................................... 714/711, 719,
                                    714/172, 42, 718, 743

[56]         References Cited

U.S. PATENT DOCUMENTS

| | | | |
|---|---|---|---|
| 4,628,509 | 12/1986 | Kawaguchi | 714/711 |
| 5,062,109 | 10/1991 | Oshima et al. | 714/719 |
| 5,363,382 | 11/1994 | Tsukakoshi | 714/719 |
| 5,522,062 | 5/1996 | Yamaki | 711/172 |
| 5,530,805 | 6/1996 | Tanabe | 714/42 |
| 5,841,785 | 11/1998 | Suzuki | 714/718 |

FOREIGN PATENT DOCUMENTS

| | | |
|---|---|---|
| 55-108999 | 8/1980 | Japan . |
| 1-128300 | 5/1989 | Japan . |
| 3-44583 | 2/1991 | Japan . |
| 4-53100 | 2/1992 | Japan . |

*Primary Examiner*—Albert De Cady
*Assistant Examiner*—David Ton
*Attorney, Agent, or Firm*—Gallagher & Lathrop; David N. Lathrop

[57]            ABSTRACT

There is provided a memory testing apparatus for testing an IC memory having a failure relief line or lines, which is constructed to sufficiently serve to test using a failure analysis memory having its storage capacity of two times that of a memory under test. An extended storage area having its storage capacity approximately equal to that of a memory under test MUT is provided in a failure analysis memory having a main storage area whose storage capacity is the same as that of the memory under test adjacent to one side of the main storage area in either one of the row address direction (X coordinate direction) or column address direction (Y address direction) thereof. In addition, an address converter is provided for converting an address signal for accessing the failure relief line or lines of the memory under test into an address signal for accessing the extended storage area to write position information of a failure memory cell or cells on the failure relief line or lines in the extended storage area of the failure analysis memory.

5 Claims, 6 Drawing Sheets

| | ADDRESS INPUTS FOR ADDRESS CONVERSION MEANS | | | | | | WRITING ADDRESSES TO FAILURE ANALYSIS MEMORY | | | | | |
|---|---|---|---|---|---|---|---|---|---|---|---|---|
| | 4 | 3 | 2 | 1 | 0 | | 4 | 3 | 2 | 1 | 0 | |
| (X,Y) | X10 | X9 | Y11 | Y10 | Y9 | | X10' | X9' | Y11' | Y10' | Y9' | (X',Y') |
| (0,0) | 0 | 0 | 0 | 0 | 0 | | 0 | 0 | 0 | 0 | 0 | (0,0) |
| (1,0) | 0 | 1 | 0 | 0 | 0 | | 0 | 1 | 0 | 0 | 0 | (1,0) |
| (2,0) | 1 | 0 | 0 | 0 | 0 | | 1 | 0 | 0 | 0 | 0 | (2,0) |
| (3,0) | 1 | 1 | 0 | 0 | 0 | | 1 | 1 | 0 | 0 | 0 | (3,0) |
| (0,1) | 0 | 0 | 0 | 0 | 1 | | 0 | 0 | 0 | 0 | 1 | (0,1) |
| (1,1) | 0 | 1 | 0 | 0 | 1 | | 0 | 1 | 0 | 0 | 1 | (1,1) |
| (2,1) | 1 | 0 | 0 | 0 | 1 | | 1 | 0 | 0 | 0 | 1 | (2,1) |
| (3,1) | 1 | 1 | 0 | 0 | 1 | | 1 | 1 | 0 | 0 | 1 | (3,1) |
| (0,2) | 0 | 0 | 0 | 1 | 0 | | 0 | 0 | 0 | 1 | 0 | (0,2) |
| (1,2) | 0 | 1 | 0 | 1 | 0 | | 0 | 1 | 0 | 1 | 0 | (1,2) |
| (2,2) | 1 | 0 | 0 | 1 | 0 | | 1 | 0 | 0 | 1 | 0 | (2,2) |
| (3,2) | 1 | 1 | 0 | 1 | 0 | | 1 | 1 | 0 | 1 | 0 | (3,2) |
| (0,3) | 0 | 0 | 0 | 1 | 1 | | 0 | 0 | 0 | 1 | 1 | (0,3) |
| (1,3) | 0 | 1 | 0 | 1 | 1 | | 0 | 1 | 0 | 1 | 1 | (1,3) |
| (2,3) | 1 | 0 | 0 | 1 | 1 | | 1 | 0 | 0 | 1 | 1 | (2,3) |
| (3,3) | 1 | 1 | 0 | 1 | 1 | | 1 | 1 | 0 | 1 | 1 | (3,3) |
| (0,4) | 0 | 0 | 1 | 0 | 0 | → | 1 | 1 | 0 | 0 | 0 | (3,0) |
| (1,4) | 0 | 1 | 1 | 0 | 0 | → | 1 | 1 | 0 | 0 | 1 | (3,1) |
| (2,4) | 1 | 0 | 1 | 0 | 0 | → | 1 | 1 | 0 | 1 | 0 | (3,2) |
| (3,4) | 1 | 1 | 1 | 0 | 0 | | 1 | 1 | 0 | 1 | 1 | (3,4) |
| (0,5) | 0 | 0 | 1 | 0 | 1 | | 0 | 0 | 1 | 0 | 1 | (0,5) |
| (1,5) | 0 | 1 | 1 | 0 | 1 | | 0 | 1 | 1 | 0 | 1 | (1,5) |
| (2,5) | 1 | 0 | 1 | 0 | 1 | | 1 | 0 | 1 | 0 | 1 | (2,5) |
| (3,5) | 1 | 1 | 1 | 0 | 1 | | 1 | 1 | 1 | 0 | 1 | (3,5) |
| (0,6) | 0 | 0 | 1 | 1 | 0 | | 0 | 0 | 1 | 1 | 0 | (0,6) |
| (1,6) | 0 | 1 | 1 | 1 | 0 | | 0 | 1 | 1 | 1 | 0 | (1,6) |
| (2,6) | 1 | 0 | 1 | 1 | 0 | | 1 | 0 | 1 | 1 | 0 | (2,6) |
| (3,6) | 1 | 1 | 1 | 1 | 0 | | 1 | 1 | 1 | 1 | 0 | (3,6) |
| (0,7) | 0 | 0 | 1 | 1 | 1 | | 0 | 0 | 1 | 1 | 1 | (0,7) |
| (1,7) | 0 | 1 | 1 | 1 | 1 | | 0 | 1 | 1 | 1 | 1 | (1,7) |
| (2,7) | 1 | 0 | 1 | 1 | 1 | | 1 | 0 | 1 | 1 | 1 | (2,7) |
| (3,7) | 1 | 1 | 1 | 1 | 1 | | 1 | 1 | 1 | 1 | 1 | (3,7) |

FIG. 5

MEMORY TESTER

TECHNICAL FIELD

The present invention relates to a memory testing apparatus for testing a memory constructed in the form of a semiconductor integrated circuit (IC) (hereinafter referred to as IC memory), and more particularly, to a memory testing apparatus provided with a failure analysis memory for storing position information of a defective or failure memory cell in a tested IC memory.

BACKGROUND ART

Storage capacity of an IC memory is increasing more and more, and accordingly an increased IC chip area and formation of patterns at high density are required. As a result, there is an increased possibility that a reduction of the yield of IC memories caused by a very minute defect occurs. In order to prevent the yield of IC memories from being reduced, there are manufactured IC memories in each of which, for example, a failure memory cell can be electrically replaced by a spare or alternative memory cell (also called a relief line or spare line). The IC memory of this kind is called a memory of redundancy structure in this technical field, and a decision as to whether or not the redundancy-structured memory can be relieved is rendered by referring to failure information (positions of occurrences of failure memory cells, the number of occurrences of failure memory cells, and the like) stored in a failure analysis memory.

FIG. 6 shows a block diagram of a general construction of an example of a conventional memory testing apparatus provided with a failure analysis memory. This memory testing apparatus comprises a pattern generator 11, a logical comparator 12 and a failure analysis memory 13. The pattern generator 11 generates, in response to a reference clock from a timing generator not shown, an address signal, a test pattern signal, a control signal and the like all of which are to be supplied to an IC memory under test (hereinafter also referred to simply as memory under test) MUT as well as generates an expected value signal to be supplied to the logical comparator 12. The test pattern signal is applied to the memory under test MUT, and is written in an address of the memory under test MUT specified by an address signal applied thereto simultaneously with the test pattern signal.

The test pattern signal written in the memory under test NUT is temporarily stored therein and thereafter is read out thereof. The read-out test pattern signal is inputted to the logical comparator 12. An expected value signal from the pattern generator 11 is supplied to the logical comparator 12 where the test pattern signal read out of the memory under test MUT is logically compared with the expected value signal to detect as to whether or not there is an anti-coincidence or mismatch between both signals.

If both signals do not coincide with each other, the logical comparator 12 outputs a failure signal (failure data) having, for example, logic "1" (logic H) to the failure analysis memory 13 to store it therein at an address thereof specified by an address signal supplied through an address bus line 14 from pattern generator 11. Usually, when both the signals coincide with each other, the logical comparator 12 generates a pass signal which is not stored in the failure analysis memory 13.

In such a way, the information on failure memory cells in the memory under test MUT generated during a series of tests is stored in the failure analysis memory 13. After the tests have been completed, a failure analysis for the memory under test MUT is carried out with reference to the failure information stored in the failure analysis memory 13.

For this end, the failure analysis memory 13 has the same operating rate or speed and storage capacity as those of the memory under test MUT, and the same address signal as that applied to the memory under test MUT is applied to the failure analyses memory 13 from the pattern generator 11 via the address bus line 14.

The failure analysis memory 13 is initialized prior to the start of a test. For example, when initialized, the failure analysis memory 13 has data of logic "0s": written in all of the addresses thereof. Every time a failure signal representing that an anti-coincidence is generated from the logical comparator 12 in the test of a memory under test MUT, a failure signal of, for example, logic "1" is written in the same address of the failure analysis memory 13 as that of the memory cell of the memory under test which has generated the anti-coincidence signal, the failure signal of logic "1" representing a failure of that memory cell.

Here, the redundancy-structured memory described above is provided with, as shown in FIG. 6, column (longitudinal row) failure relief lines LX and row (lateral row) failure relief lines LY in addition to a main storage area M. In this example, there is shown a case in which two column failure relief lines LX and two row failure relief lines LY are provided respectively in parallel with one side in the row (lateral row) address direction (left to right direction in the drawing (this direction is defined as X direction)) of the main storage area M of the failure analysis memory 13 and one side in the column (longitudinal row) address direction (up-and-down direction in the drawing (this direction is defined as Y direction)) of the main storage area M thereof.

In case the memory under test MUT is a memory of redundancy structure as shown in FIG. 6, it is needless to say that it is also desired to render a decision as to whether those failure relief lines LX and LY are defective or failures or not. In order to render such decision on the failure relief lines LX and LY, it is necessary to provide in the failure analysis memory 13 a memory area for storing failure positions of memory cells in the failure relief lines LX and LY.

Assuming that the main storage area M of the memory under test MUT shown FIG. 6 has a storage capacity of 1M bits, the storage capacity of the failure analysis memory 13 also has 1M bits which is the same storage capacity as that of the main storage area M of the memory under test MUT, if it is unnecessary to render a decision as to whether or not the failure relief lines LX and LY are defective. However, if it is also necessary to render a decision as to whether or not the failure relief lines LX and LY are defective, the storage capacity of the failure analysis memory 13 must have bits of the sum of 1M bits and additional bits for an additional storage area for storing those failure relief lines LX and LY.

On the other hand, in case only the main storage area M of the memory under test MUT is accessed, the pattern generator 11 suffices to generate a row direction address signal and a column direction address signal the number of bits of each of which has 10 bits ($2^{10} \times 2^{10} = 1048576$). However, in case the memory under test MUT is accessed on its all addresses including the failure relief lines LX and LY in addition to the main storage area M, the pattern generator 11 must generate the row direction address signal of 11 bits and the column direction address signal of 11 bits ($2^{11} \times 2^{11} = 4194304$) in which one habit is further added to each of the row direction address signal and the column direction address signal, since it is impossible to access all addresses of the memory under test MUT including the failure relief lines LX and LY and the main storage area M by the row direction address signal of 10 bits and the column direction address signal of 10 bits. That is, address signals capable of accessing a storage area of 4M bits must be generated from the pattern generator 11.

Since the failure analysis memory 13 is generally constructed using one or more commercially available IC memories, it is the case that an IC memory is not commercially available, which has a storage capacity exactly corresponding to the sum of the main storage area M and the storage areas of the failure relief lines LX and LY. For example, although an IC memory having a storage capacity of 1M bits, 2M bits, 4M bits, 8M bits or the like is commercially available, an IC memory having a storage capacity of 1.1M bits, 1.15M bits, 1.2M bits, 1.3M bits or the like is not commercially available. For this reason, heretofore, the failure analysis memory 13 is conventionally constructed, as shown in FIG. 7, using four 1M bit memories MA, MB, MC and MD each of which has the same storage capacity (1M bits) as that of the main storage area M of the memory under test MUT, and failure memory cell positions of the main storage area M of the memory under test MUT are stored in the memory MA and failure memory cell positions of the failure relief lines LX and LY are stored in the remaining three memories MB, MC and MD.

That is, in order to provide in the failure analysis memory 13 a storage area covering the side portions on which the failure relief lines LX and LY on the periphery of the main storage area M of the memory under test MUT are formed respectively, three memories each having the same storage capacity as that of the main storage area M (1M bits) of the memory under test MUT are heretofore used, and therefore, the failure analysis memory 13 has to have its storage capacity of four times the storage capacity of the main storage area M of the memory under test MUT. In addition, in order to access the failure analysis memory 13 of 4M bit capacity, it has been necessary to generate the row direction address signal of 11 bits and the column direction address signal of 11 bits.

As mentioned above, in order to store the very small information of the failure memory cell positions of the failure relief lines LX and LY, the failure analysis memory 13 having its storage capacity of four times that of the main storage area M of the memory under test MUT must be heretofore constructed. Therefore, there is a drawback that the cost needed to manufacture the failure analysis memory 13 becomes high.

In addition, generally, there are many cases in the memory testing apparatus of this type that a plurality of memories under test are measured at the same time. In case there is a limitation on the total storage capacity of the failure analysis memory 13, if the storage capacity of one failure analysis memory 13 is large, the number of failure analysis memories which can be provided in one memory testing apparatus is reduced. Since the number of the memories under test to be measured at the same time in one test is equal to the number of the failure analysis memories, there is also a disadvantage that the number of memories under test to be measured at the same time is decreased, and hence the efficiency of test becomes deteriorated (throughput is lowered).

DISCLOSURE OF THE INVENTION

It is an object of the present invention to provide a memory testing apparatus which can reduce the storage capacity of a failure analysis memory to approximately two times that of a memory under test.

It is another object of the present invention to provide a memory testing apparatus in which the cost of a failure analysis memory can be reduced so that the entire testing apparatus can be manufactured at low cost.

Yet another object of the present invention is to provide a memory testing apparatus in which the storage capacity of a failure analysis memory can be reduced while the number of memories under test that the testing apparatus is capable of testing at the same time can be increased.

According to the present invention, in order to accomplish the above objects, there is provided a memory testing apparatus wherein a test pattern signal outputted from a pattern generator is written in a memory under test, a signal read out of the memory under test is logically compared with an expected value signal outputted from said pattern generator in logical comparator means, if there is an anti-coincidence between both the signals, a failure signal representing the anti-coincidence is stored in a failure analysis memory at an address thereof which is the same as the address of a failure memory cell in the memory under test from which the anti-coincidence has been detected, and after completion of a test, a failure analysis of the memory under test is carried out, the memory testing apparatus being characterized in that an extended storage area is provided in the failure analysis memory adjacent to a main storage area of the failure analysis memory in either one of the row address direction or column address direction of the main storage area, and that an address conversion means is provided which converts, when the testing apparatus tests a memory under test having a failure relief line or lines, an address signal for accessing the failure relief line or lines into an address signal for accessing the extended storage area to write position information of a failure memory cell or cells on the failure relief line or lines in the extended storage area of the failure analysis memory.

The storage capacity of the extended storage area of the failure analysis memory may be approximately equal to the storage capacity of the main storage area of the failure analysis memory.

In a preferred embodiment, an address bus line spanning from the pattern generator to the failure analysis memory is branched into two address bus lines one of which is directly connected to the failure analysis memory and the other of which is connected to the failure analysis memory via the address conversion means. Most significant bit or bits of an address signal outputted from the pattern generator are supplied to the address conversion means and the remaining lower bit or bits of the address signal outputted from the pattern generator are directly supplied to the failure analysis memory.

In addition, the address conversion means supplies an address signal for accessing a failure relief line or lines of the memory under test provided in an area thereof corresponding to the extended storage area of the failure analysis memory to the failure analysis memory without conversion of address, and converts an address signal for accessing a failure relief line or lines of the memory under test provided in an area thereof which is not corresponding to the extended storage area of the failure analysis memory into an address signal for accessing a particular area in the extended storage area of the failure analysis memory.

Therefore, according to the present invention, the storage area (storage capacity) of the failure analysis memory may be approximately two times that of a memory under test, resulting in an advantage that the amount of the memory used in the failure analysis memory can be reduced by a half.

BRIEF DESCRIPTION OF THE DRAWINGS

FIG. 5 is a diagram showing one of conversion examples of address signals in the address conversion means used in the memory testing apparatus shown in FIG. 1;

BEST MODE FOR CARRYING OUT THE INVENTION

Figure 1:
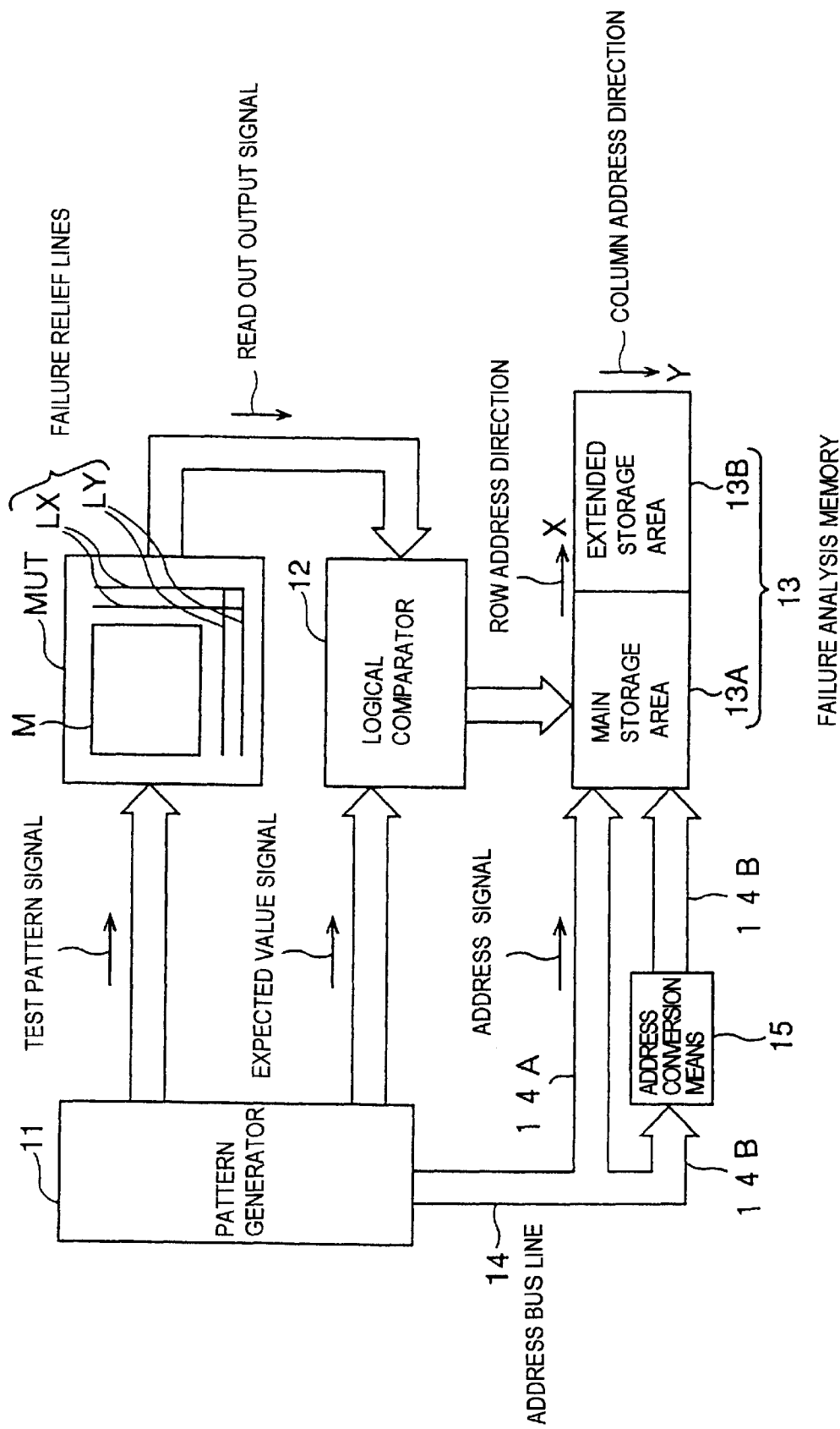
FIG. 1 is a block diagram showing the general construction of an embodiment of the memory testing apparatus according to the present invention.

FIG. 1 is a block diagram showing the general construction of an embodiment of the memory testing apparatus according to the present invention. In the present invention, an extended storage area 13B is provided in a failure analysis memory 13 which has a main storage area 13A having the same storage capacity as that of a main storage area M of a memory under test MUT. This extended storage area 13B is formed, in FIGS. 1 and 2, adjacent to one side of the main storage area 13A in the row address direction (X direction) thereof. However, the extended storage area 13B may be formed adjacent to one side of the main storage area 13A in the column address direction (Y direction) thereof. That is, the extended storage area 13B may be formed adjacent to either one side of the main storage area 13A of the failure analysis memory 13 in the row address direction or in the column address direction thereof.

This extended storage area 13B can be constructed by a memory having the same storage capacity as that of the main storage area 13A. An address input terminal of the memory which constitutes the extended storage area 13B is connected to the address bus line 14 such that the extended storage area can be accessed in concatenation with the main storage area in the row address direction (X direction). That is, the failure analysis memory 13 is constructed such that continuous accesses can be performed between the main storage area 13A and the extended storage area 13B, i.e., addresses of one row of the main storage area 13A are sequentially accessed in the row address direction (X direction), then after the last address of that row of the main storage area 13A is accessed, the access point is moved to the first address of the same row of the extended storage area 13B, then addresses of the same row of the extended storage area 13B are sequentially accessed, and after the last address of that row of the extended storage area 13B is accessed, the access point is returned to the first address of the next row of the main storage area 13A.

Figure 2:
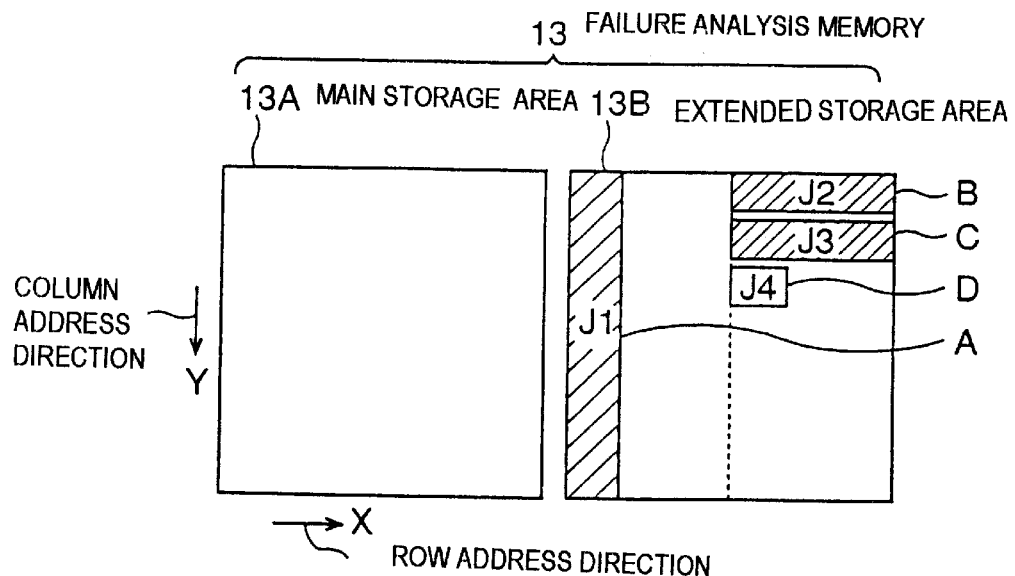
FIG. 2 is a diagram for explaining a construction of the failure analysis memory used in the memory testing apparatus shown in FIG. 1.
Figure 3:
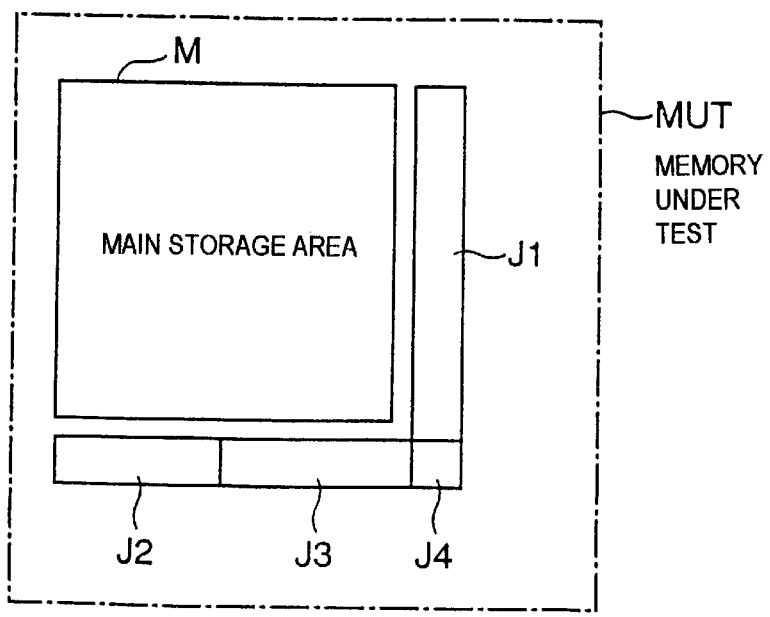
FIG. 3 is a diagram for explaining an example of the memory under test tested by the memory testing apparatus shown in FIG. 1.

As shown in FIGS. 1 and 2, in case that the extended storage area 13B is formed adjacent to one side of the main storage area 13A of the failure analysis memory 13 in the row address direction (X direction) thereof, as shown in FIG. 3, information of a failure cell position or positions J1 on column relief lines LX provided in the memory under test MUT can directly be written in an area A of the extended storage area 13B corresponding to an address in the memory under test MUT. However, information of a failure cell position or positions J2, J3 (shown separately as J2 and J3 for easy understanding) of row relief lines LY provided in the memory under test MUT and information of a failure cell position or positions J4 of an overlapped portion of both the relief lines LX and LY cannot directly be written in the extended storage area 13B.

Therefore, in the present invention, the address bus line 14 spanning from the pattern generator 11 to the input terminal of the failure analysis memory 13 is branched into two address bus lines one (14A) of which is directly connected to the failure analysis memory 13 and the other (14B) of which is connected to the failure analysis memory 13 via the address conversion means 15. Further, least significant bit or bits (the least significant bit or the least significant bit and one or more bits directly adjacent thereto) of the address signal for accessing the memory under test MUT are supplied to the one address bus line 14A, and most significant bit or bits (the most significant bit or the most significant bit and one or more bits directly adjacent thereto) of the address signal for accessing the memory under test MUT are supplied to the other address bus line 14B, thereby converting only the bits requiring the address conversion by the address conversion means 15.

In other words, in the illustrated example, the failure cell position information J1 of the column relief lines LX provided in the memory under test MUT can directly be written, as mentioned above, in a area indicated as A in the extended storage area 13B of the failure analysis memory 13 corresponding to an address in the memory under test MUT. Therefore, the failure cell position information J1 is supplied to the failure analysis memory 13 without conversion of address by the address conversion means 15. That is, although most significant bits of the row address signal are supplied to the address conversion means 15, those most significant bits are directly supplied to the failure analysis memory 13 without conversion of their addresses. However, the failure cell position information J2, J3 of the row relief lines LY and the failure cell position information J4 of the overlapped portion of both the relief lines LX and LY cannot directly be written in the extended storage area 13B. Therefore, as shown in FIG. 2, the most significant bits of the column address signal are converted in the address conversion means 15 so that the failure cell position information J2, J3 and J4 can be written respectively in areas indicated by B, C and D in a right half storage area in the drawing of the extended storage area 13B. Information of such address conversion is previously stored in the address conversion means 15.

Figure 4:
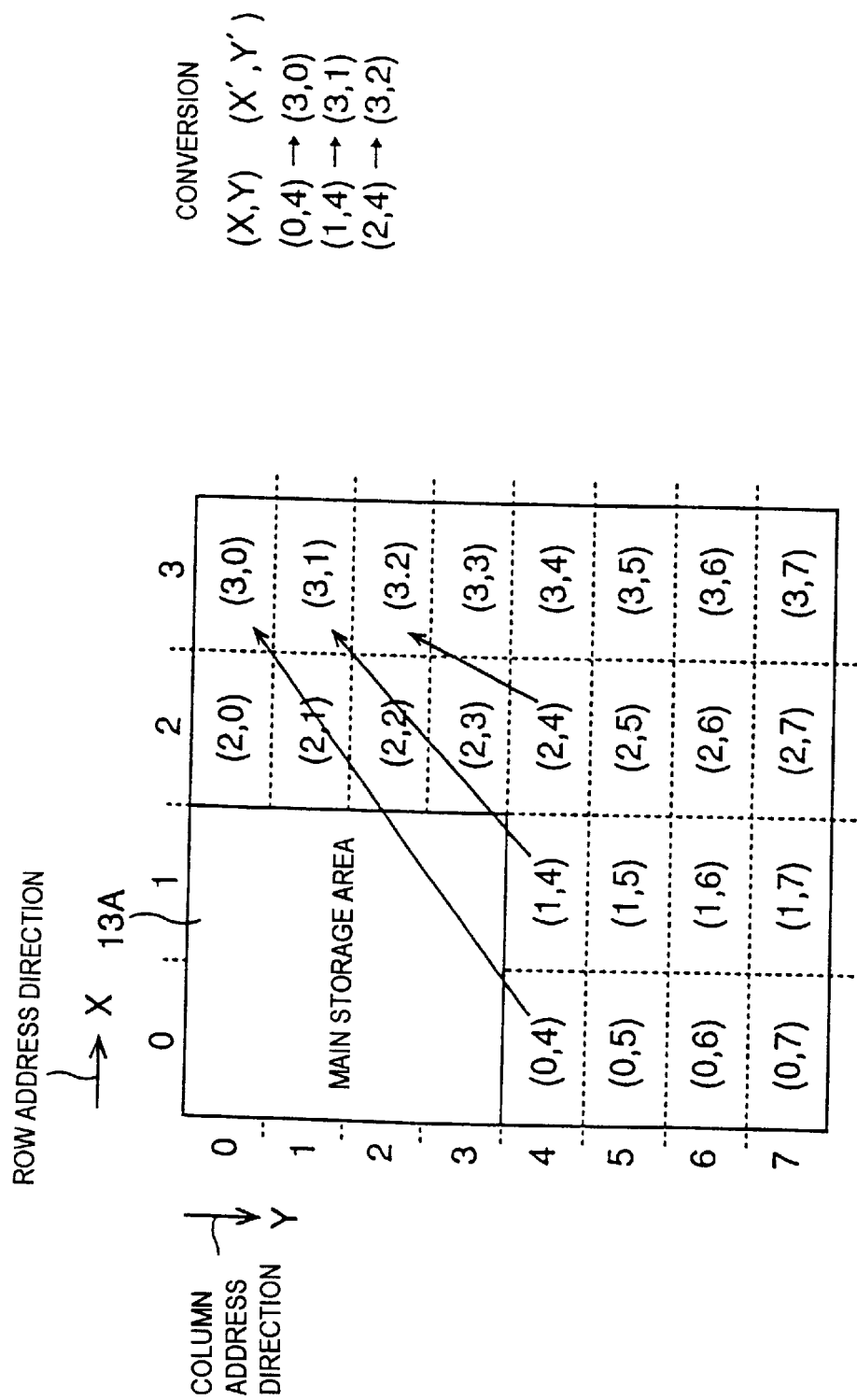
FIG. 4 is a diagram for explaining the operation of an address conversion means used in the memory testing apparatus shown in FIG. 1.
Figure 6:
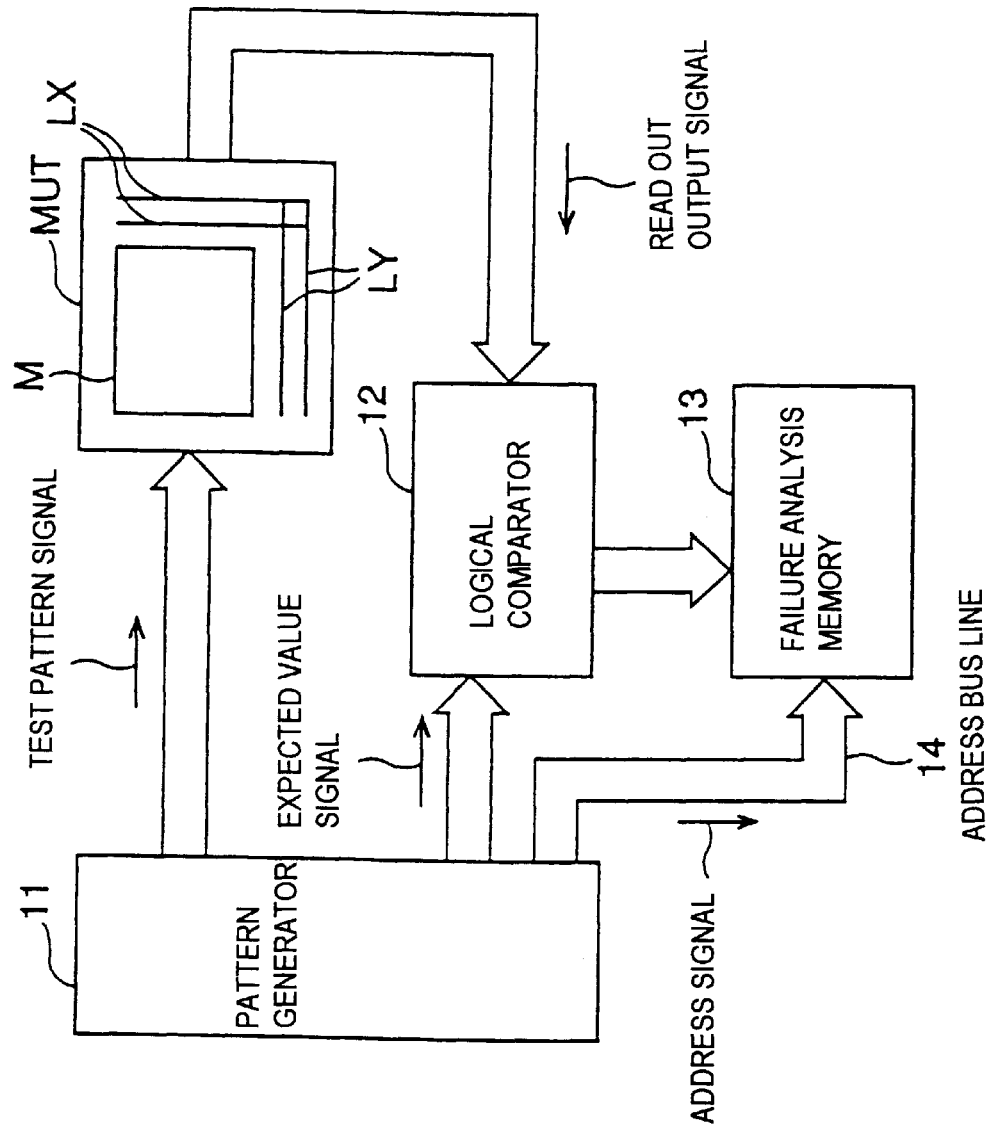
FIG. 6 is a block diagram showing the general construction of an example of the conventional memory testing apparatus.
Figure 7:
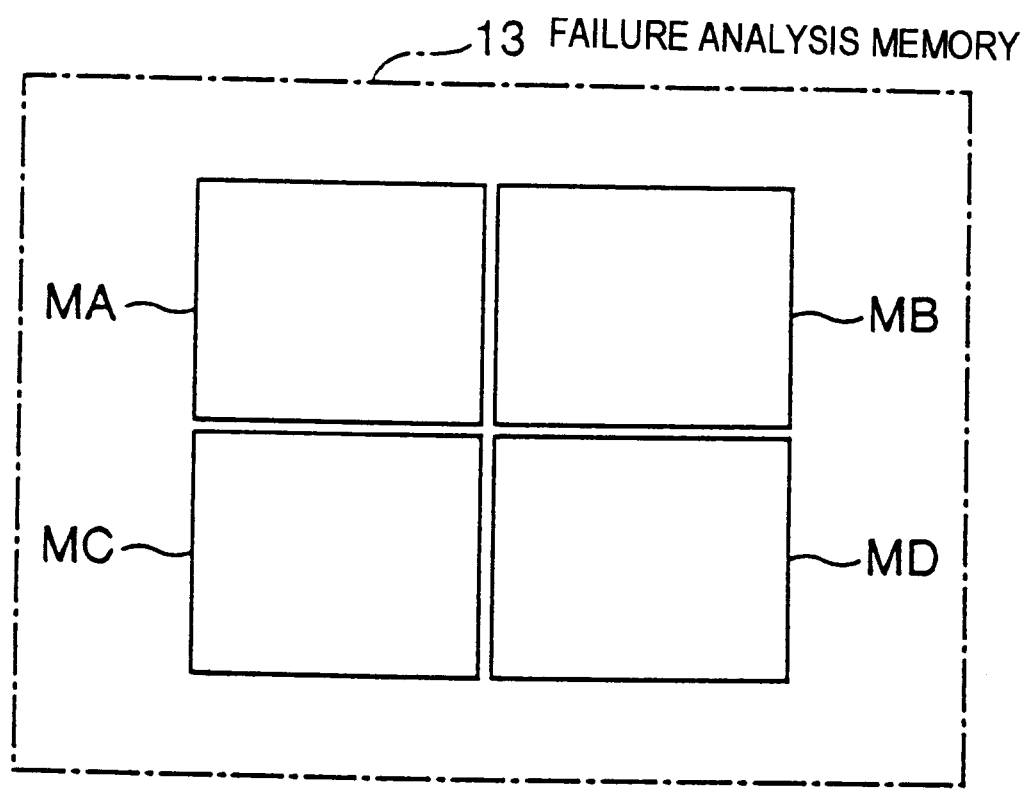
FIG. 7 is a diagram for explaining a construction of the failure analysis memory used in the memory testing apparatus shown in FIG. 6.

Next, a specific example of the address conversion as stated above will be described with reference to FIGS. 4 and 5. FIG. 4 is a diagram for explaining how the failure cell position information J2, J3 of the row relief lines LY and the failure cell position information J4 of the overlapped portion of both the relief lines LX and LY can be written in the extended storage area 13B of the failure analysis memory 13 through the address conversion. Further, in FIG. 4, there is shown a case in which the entire storage area is divided into four areas (equal areas) in the row address direction (X coordinate direction) thereof and eight areas (equal areas) in the column address direction (Y coordinate direction) thereof. Such division of the entire storage area, however, is effected only for clarity of explanation since the failure cell position information J2, J3 of the row relief lines LY and the failure cell position information J4 of the overlapped portion of both the relief lines LX and LY of the memory under test MUT have a capacity which can be written in the divided unit areas shown in FIG. 4, respectively.

Respective divided areas of the failure analysis memory 13 have area numbers assigned thereto such as (0, 4), (1, 4), . . . represented by the X coordinate and the Y coordinate except the main storage area 13A thereof. These area numbers are not addresses but merely numbers of the divided areas. However, the following discussion will be made assuming that each of the numbers of the divided areas (coordinate locations) is a large address (area address).

In FIG. 4, the main storage area 13A of the failure analysis memory 13 comprises the divided areas defined by X coordinates of 0 and 1, and Y coordinates of 0, 1, 2 and 3. That is, the main storage area 13A has eight addresses for respective eight divided areas therein. On the other hand, the divided areas which contain the row relief lines LY are defined by X coordinates of 0 and 1, and Y coordinate of 4. Further, the divided area which contains the overlapped portion of both the relief lines LX and LY is defined by X coordinate of 2, and Y coordinate of 4. That is, those areas have addresses (0, 4), (1, 4) and (2, 4). Therefore, as shown in the right hand side of FIG. 4, if the addresses of the divided areas (0, 4), (1, 4) and (2, 4) are converted into addresses (3, 0), (3, 1) and (3, 2) respectively, the failure cell position information J2, J3 of the row relief lines LY, and the failure cell position information J4 of the overlapped portion of both the relief lines LX and LY of the memory under test MUT can be written in the extended storage area 13B of the failure analysis memory 13.

That is, if the address signals for accessing the divided areas having addresses (0, 4), (1, 4) and (2, 4) are converted into address signals for accessing the divided areas having addresses (3, 0), (3, 1) and (3, 2), respectively by the address conversion means 15, the failure cell position information J2, J3 of the row relief lines LY, and the failure cell position information J4 of the overlapped portion of both the relief lines LX and LY of the memory under test MUT can be written in the extended storage area 13B of the failure analysis memory 13. Therefore, the address conversion information has been previously stored in the address conversion means 15 so that when address signals (0, 4), (1, 4) and (2, 4) are inputted to the address conversion means 15, address signals (3, 0), (3, 1) and (3, 2) can be outputted therefrom, respectively.

FIG. 5 shows the address conversion information to be previously stored in the address conversion means 15 in case where the main storage area M of the memory under test MUT has 1M bits. Five bits shown in the left hand side of FIG. 5 indicate the most significant two bits (X10, X9) of a row address (X coordinate) signal and the most significant three bits (Y11, Y10, Y9) of a column address (Y coordinate) signal both of which are inputted to the address conversion means 15. Five bits in the right hand side indicate the most significant two bits (X10', X9') of a row address signal and the most significant three bits (Y11', Y10', Y9') of the column address signal both of which are outputted from the address conversion means 15.

In FIG. 4, row addresses (X coordinates) are divided into four large groups and column addresses (Y coordinates) are divided into eight large groups, respectively. Therefore, any row address can be expressed by two bits and any column address can be expressed by three bits. As a result, all of the 32 large addresses shown in FIG. 4 can be accessed by a five bit address signal. For this reason, in FIG. 5, an address signal of total five bits comprising the most significant two bits of a row address signal and the most significant three bits of a column address signal is supplied to the address conversion means 15.

It is only address signals (five bit signals) surrounded by a solid line frame in FIG. 5 among the row and column address signals that require the address conversion thereof, in this example. Accordingly, as shown in FIG. 5, when the address signals (the most significant five bits) of "00100", "01100" and "10100" for accessing addresses (0, 4), (1, 4) and (2, 4) respectively are inputted to the address conversion means 15, it outputs converted address signals of "11000", "11001" and "11010", respectively. That is, the address conversion means 15 converts the address signals for accessing the addresses (0, 4), (1, 4) and (2, 4) into the address signals for accessing the areas indicated by B, C and D in the extended storage area 13B. Further, in FIG. 5, when an address signal of "11100" for accessing an address (3, 4) is inputted, the address conversion means 15 also converts this address signal into an address signal of "11011" for accessing an address (3, 3) in the extended storage area 13B. This is merely due to the reason that an address (3, 3) exists in the extended storage area 13B, and hence such address conversion information is stored in the address conversion means 15. In this example, the address signal of "11100" may be outputted without address conversion.

The remaining least significant eight bits (X8–X1) of the row address signal and the remaining least significant eight bits (Y8–Y1) of the column address signal to be directly supplied to the failure analysis memory 13 are used to access respective addresses in each of the largely divided address areas.

Further, in the embodiment described above, the case in which the extended storage area 13B of the failure analysis memory 13 is disposed adjacent to one side of the main storage area 13A in the row address direction (X coordinate direction) thereof is explained. However, even if the extended storage area 13B is disposed adjacent to one side of the main storage area 13A in the column address direction (Y coordinate direction) thereof, it will be easily understood that the position information of failure memory cells on the column relief lines LX of the memory under test MUT and the position information of failure memory cells on the overlapped portion of both the relief lines LX and LY can similarly be written in that extended storage area of the failure analysis memory 13.

In addition, it is needless to say that the present invention can also be applied to a case in which the number of the row failure relief lines and the number of the column failure relief lines are one (1) respectively, and further to a case in which the number of the row failure relief lines and the number of the column failure relief lines are three (3) or more respectively. Further, the storage capacity of the extended storage area 13B of the failure analysis memory 13 may be smaller than the storage capacity of the main storage area 13A. However, as described before, since there is no IC memory having a fractional storage capacity which is commercially available, an IC memory having the same storage capacity as that of the main storage area 13A is generally used.

As explained above, according to the present invention, in a memory testing apparatus for testing an IC memory having a failure relief line or lines, the failure analysis memory used therein may have its storage capacity of two times the storage capacity of the main storage area of the memory under test MUT. Therefore, the storage capacity of the failure analysis memory is reduced to ½ of a conventional failure analysis memory. As a result, there is obtained an advantage that the cost of the failure analysis memory 13 can be reduced, resulting in that the memory testing apparatus can be manufactured at low cost by that much.

In addition, even if there is a limit in the total storage capacity of the failure analysis memory, the number of memories under test that can be simultaneously tested and measured at a time is doubled as compared with a conventional memory testing apparatus since the storage capacity of one failure analysis memory is reduced to ½. As a result, there is also obtained an advantage that the number of memories under test which can be measured at the same time is increased and hence the efficiency of test is improved (throughput is improved).

What is claimed is:

1. A memory testing apparatus wherein a test pattern signal outputted from a pattern generator is written in a memory under test, a signal read out of the memory under test is logically compared with an expected value signal outputted from said pattern generator in logical comparator means, if there is an anti-coincidence between both the signals, a failure signal representing the anti-coincidence is stored in a failure analysis memory at an address thereof which is the same as the address of a failure memory cell in the memory under test from which the anti-coincidence has been detected, and after completion of a test, a failure analysis of the memory under test is carried out, said memory testing apparatus comprising:

an extended storage area provided in said failure analysis memory adjacent to a main storage area of the failure analysis memory in either one of the row address direction or column address direction of said main storage area, and an address conversion means that converts, when the testing apparatus tests a memory under test having a failure relief line or lines, an address signal for accessing said failure relief line or lines into an address signal for accessing said extended storage area to write position information of a failure memory cell or cells on said failure relief lines in said extended storage area of said failure analysis memory, wherein said address conversion means supplies an address signal for accessing the failure relief line or lines of the memory under test provided in an area thereof corresponding to said extended storage area of said failure analysis memory to said failure analysis memory without conversion of address, and converts an address signal for accessing the failure relief line or lines of the memory under test provided in an area thereof which is not corresponding to said extended storage area of said failure analysis memory into an address signal for accessing a particular area in said extended storage area of said failure analysis memory.

2. The memory testing apparatus according to claim 1, wherein the storage capacity of said extended storage area of said failure analysis memory is approximately equal to the storage capacity of said main storage area of said failure analysis memory.

3. The memory testing apparatus according to claim 1, wherein an address bus line spanning from said pattern generator to said failure analysis memory is branched into two address bus lines one of which is directly connected to said failure analysis memory and the other of which is connected to said failure analysis memory via said address conversion means.

4. The memory testing apparatus according to claim 3, wherein most significant bit or bits of an address signal outputted from said pattern generator are supplied to said address conversion means and the remaining lower bit or bits of the address signal outputted from said pattern generator are directly supplied to said failure analysis memory.

5. The memory testing apparatus according to claim 4, wherein said address conversion means has corresponding bits previously written therein, which are to be outputted when the most significant bit or bits of the address signal outputted from said pattern generator are supplied to said address conversion means.

* * * * *